United States Patent [19]

Adair et al.

[11] Patent Number: 4,956,309
[45] Date of Patent: Sep. 11, 1990

[54] MICROROUGHENED DEVELOPER SHEET FOR FORMING HIGH DENSITY IMAGES

[75] Inventors: Paul C. Adair, Springboro; Cheryl L. Moore, Springfield, both of Ohio

[73] Assignee: The Mead Corporation, Dayton, Ohio

[21] Appl. No.: 280,420

[22] Filed: Dec. 6, 1988

[51] Int. Cl.⁵ .................. G03C 1/96; G03C 1/68; G03C 7/00
[52] U.S. Cl. .................. 430/138; 430/207; 430/211; 503/207; 503/214; 503/226
[58] Field of Search .............. 430/138, 207, 211; 503/207, 226, 214

[56] References Cited

U.S. PATENT DOCUMENTS

| | | | |
|---|---|---|---|
| 3,919,450 | 11/1975 | Shimizu et al. | 503/226 |
| 4,081,188 | 3/1978 | Westcott | 503/226 |
| 4,211,437 | 7/1980 | Myers et al. | 503/207 |
| 4,268,069 | 5/1981 | Stolfo | 282/27.5 |
| 4,399,209 | 8/1983 | Sanders et al. | 430/138 |
| 4,486,762 | 12/1984 | Okamoto et al. | 503/207 |
| 4,536,463 | 8/1985 | Sanders | 430/138 |
| 4,554,235 | 11/1985 | Adair et al. | 430/138 |
| 4,675,706 | 6/1987 | Miller et al. | 503/210 |
| 4,772,530 | 9/1988 | Gottschalk et al. | 430/138 |
| 4,772,532 | 9/1988 | Adair et al. | 430/138 |
| 4,814,252 | 3/1989 | Tamagawa et al. | 430/138 |

*Primary Examiner*—Richard L. Schilling
*Attorney, Agent, or Firm*—Thompson, Hine and Flory

[57] ABSTRACT

A receiver sheet for producing high density images, preferably in a photosensitive imaging system is disclosed. The receiver sheet is characterized by containing a particulate developer material which does not substantially compress upon the application of pressure. The resistance to pressure is accomplished by using a receiver sheet which has a discontinuous thickness or by incorporating a stilt material into the developer material. Also disclosed is an imaging system which has a discontinuous thickness donor sheet to prevent the developer material from substantially compressing upon the application of pressure.

12 Claims, 3 Drawing Sheets

MICROROUGHENED DEVELOPER SHEET FOR FORMING HIGH DENSITY IMAGES

BACKGROUND OF THE INVENTION

1. Field of the Invention

The present invention relates to a developer sheet for forming high density images. More particularly, the developer sheet contains a developer material on its upper surface which, upon the application of pressure, does not significantly deform.

2. Description of the Prior Art

Transfer carbonless copy systems and transfer imaging systems are well known in the art. These systems comprise two sheets which are used to form a visible image. The first sheet, the transfer or donor sheet, typically contains on one of its surfaces, a colorless color-forming agent. Often, the color-forming agent is contained in pressure rupturable microcapsules. The second sheet, the developer or receiver sheet, typically is a substrate having a layer of a developer material which reacts with the colorless color-forming agent to form a visible image coated onto its front surface. In practice, to produce an image, the two sheets are aligned so that the colorless color-forming agent faces the developer material. Upon the application of pressure, the colorless color-forming agent reacts with the developer material on the developer sheet to form a visible image.

For a particular technical application, photosensitive imaging systems employing microencapsulated radiation sensitive compositions which are the subject of commonly assigned U.S. Pat. No. 4,399,209 to The Mead Corporation as well as copending U.S. patent application Ser. No. 320,643 filed Jan. 18, 1982, now U.S. Pat. No. 4,440,846, (corresponding to U.K. 2,113,860) have been developed. These imaging systems are characterized in that an imaging sheet including a layer of microcapsules containing a photosensitive composition in the internal phase is image-wise exposed to actinic radiation. In the most typical embodiments, the photosensitive composition is a photopolymerizable composition including a polyethylenically unsaturated compound and a photoinitiator and is encapsulated with a color former. The image-wise exposure hardens the internal phase of the microcapsules. Following exposure, the imaging sheet is assembled with a developer sheet and the assembly is subjected to a uniform rupturing force by passing the sheets through the nip between a pair of pressure rollers. Upon passing through the pressure rollers, the microcapsules image-wise rupture and release their internal phase whereupon the color former migrates to the developer sheet and forms an image. The imaging system can be designed to produce monochromatic or polychromatic full color images.

Although this system has proven to be quite successful, minor drawbacks still occur with respect to the developer sheet. More specifically, the developer material, which is typically a phenol formaldehyde novolak resin in particulate form, is susceptible to deformation as a result of the rupturing pressure. The deformation of the developer material on the receiver sheet is undesirable as this reduces the effective size of the pores between the particles of the developer material. According to a capillary model for oil transfer, the density of the image produced is proportional to the square root of the effective capillary radius of the developer material. In regions of high layer deformation, the effective capillary radius is smaller, and therefore, the density of the image is lower due to less efficient oil transfer in these areas.

In transfer systems, two types of materials are commonly used as developer sheets. The first material is a polymeric substrate, such as polyethylene terephthalate, coated with a developer material. The end product of such a receiver sheet is typically an overhead transparency. Because of the smooth and continuous surface of the polymeric substrate, when the developer material is coated onto the substrate, a uniform coating of particulate material is obtained. As such, when the developer sheet is assembled with the imaging sheet and subjected to pressure, the developer material uniformly deforms, thereby uniformly decreasing the pore size between developer particles. Accordingly, it has been particularly difficult to obtain high density images on clear polymeric substrates.

Alternatively, the other material traditionally used as a receiver sheet is paper. Depending on the paper selected, the texture of the surface of the paper containing the developer material often is discontinuous. For most photographic uses, the surface which contains the developer material has been pre-coated with a polymer coating to simulate the properties of the polymeric developer sheet. When the developer material is coated onto the polymeric coating, there are regions where the developer material is located at a greater paper thickness than in other regions. When the developer sheet is passed through pressure rollers, it has been discovered that the particles in the higher paper thickness regions are more likely to deform. Accordingly, in the lower paper thickness regions, a higher image density is achieved. Thus, the use of paper as a receiver material to some extent can produce a higher density image, and certainly a higher density image than that produced when using a polymeric receiver sheet. However, due to the substantial deviations in thickness of the paper, the images on the paper having high density versus the images having a low density are much more pronounced. Accordingly, the produced images can have a mottled appearance. This too is undesirable for obvious reasons.

A requirement of the above described transfer system is that a sufficient pressure must be exerted on the microcapsules to enable them to rupture and release their contents. As a result of the high rupturing pressure, it is inevitable that some developer material deformation will occur. One could hypothesize that to improve the density of the produced image the rupturing pressure should be lowered. This does not necessarily result. If too low a pressure is used, not all of the image-forming microcapsules will rupture, and as a result, the desired high density images will not be obtained. In addition, not every point of the donor or imaging sheet contacts every point of the developer sheet. As a result, high pressures must be maintained across the donor or imaging sheet and developer sheet to insure a uniform contact. Accordingly, other means must be provided for remedying the pressure deformation defect of the developer sheet.

Thus, there exists a need in the art for developer sheets which are capable of producing high density images and wherein the images produced are not mottled.

SUMMARY OF THE INVENTION

In accordance with the present invention, developer sheets having a layer of developer material and imaging systems useful for forming high density images are provided. The sheets and systems are designed so that when they are passed through pressure rolls, the developer material on the sheet is not substantially deformed because of the maintainance of a pressure differential across the developer material.

By maintaining a pressure differential across the developer sheet, the particulate developer material coated onto the sheet does not uniformly deform. Rather, the particles maintained in the areas of the sheet which are subjected to the greatest amount of pressure are more deformed than the areas which receive a lesser amount of pressure. In the areas of greater deformity, the image density will be slightly lower. By comparison, in the areas of less deformity, due to the increased pore size between developer particles, the images produced will have a higher density. By maximizing the number of high density image areas on the sheet, and maximizing the pore size between developer particles, the overall image produced will have a higher density.

It is a further concern that the pressure differential across the developer sheet not be too great. If the variations between high image density areas and low image density areas are too great, as discussed above, the overall produced images may have a mottled appearance. Accordingly, while the present invention may produce a small amount of mottle as a result of the low and high density areas, it is particularly preferred that the amount of mottle be maintained at a minimum.

Several alternatives may be utilized as inventive developer sheets. For example, in accordance with one embodiment to the present invention, the developer sheet comprises a support having front and back surfaces wherein the front surface of said support is microroughened to produce a discontinuous textural surface; and a particulate developer layer containing a reactive material on said front surface, said reactive material being capable of reacting with a substantially colorless chromogenic material upon contact and generating an image.

By utilizing a developer sheet having a microroughened surface, the developer sheet will be such that some areas of the sheet containing the developer layer are thicker than others or less deformed than others. In the areas where the thickness of the sheet is greatest, when passed through pressure rolls, a higher pressure will be applied, and the developer material located at these areas will be susceptible to deformation. The high sheet thickness regions will bear most of the load as a result of the applied pressure. By comparison, in the areas where the developer material is located in between the higher thickness areas, less pressure will be applied. As such, the developer material in these areas will not significantly deform, and as a result, high density images are produced. By maintaining the number of high density areas at a maximum, an overall high density image is produced. Further, as long as the substrate is designed so that the areas of high density and low density are closely spaced, and that the low density areas are small in size, the produced image will not suffer from a mottled appearance.

In another embodiment, the developer sheet comprises a support having front and back surfaces and a developer layer containing a reactive particulate developer material on the front surface. The reactive material is capable of reacting with a substantially colorless chromogenic material upon contact and generating an image and the developer layer further contains a stilt material to absorb a significant amount of the pressure applied by the pressure rollers.

The stilt material is particularly designed so that upon the application of high amounts of pressure, the material is relatively noncompressible, i.e. has a relatively high modulus of compression. As such, the developer particles located below the stilt particles do not significantly compress, and a significant pore volume is maintained between developer particles.

In still another embodiment, the developer sheet comprises a support having front and back surfaces, a backing layer having front and back surfaces, and a continuous developer layer containing a particulate reactive material; wherein the front surface of the backing layer is attached to the back surface of the support, the backing layer is texturally discontinuous, and the developer layer being located on the front surface of the support, the reactive material being capable of reacting with a substantially colorless chromogenic material upon contact and generating an image.

In this embodiment, it is the backing layer which enables the differential pressure load to be applied to the developer material. For example, in the areas where the backing layer is thickest, the highest pressure load will be exerted on the developer material whereas in the areas where the backing layer is not as thick, the pressure exerted on the developer material will be reduced. As discussed above, the maintenance of the differential pressure gradient across the particulate developer material enables the production of high density images.

In still another embodiment, the present invention relates to a transfer system for forming images comprising a donor sheet including a support having front and back surfaces, a backing layer having front and back surfaces, and a receiver sheet having front and back surfaces;

wherein said donor sheet has a layer of microcapsules containing in their internal phases a substantially colorless chromogenic material coated on its front surface, the front surface of said backing layer being attached to the back surface of said donor sheet, said backing layer being discontinuous in thickness; and wherein said receiver sheet contains a developer material containing a particulate reactive material on its front surface, said reactive material being capable of reacting with said substantially colorless chromogenic material upon contact and generating an image.

In this embodiment, the backing layer located on the donor sheet acts to provide the pressure differential to prevent uniform deformation of the developer material. Only the areas of developer particles located directly below the highest thickness areas of the backing layer are susceptible to deformation.

In accordance with the present invention, it is particularly envisioned that the developer sheet be a transparent polymeric material, or a polymer coated paper material. In embodiments wherein a coated paper material is selected, the coating is preferably treated to provide a pressure differential across the coating.

While the present invention may be used for any type of polymeric or polymer coated paper developer sheet, it is particularly envisioned that the developer sheet be used in an imaging system including an imaging sheet including a support having a layer of photosensitive microcapsules on the surface of the support. After image-wise exposure of the imaging sheet to actinic radiation, the imaging sheet and receiver sheet are aligned and are passed through the nip of pressure rolls to rupture the microcapsules and enable the contents of the ruptured capsules to migrate to the developer material and produce a visible image.

Accordingly, it is an object of the present invention to provide a developer sheet capable of forming images having a high density.

A further object of the present invention is to provide a developer sheet wherein the produced images are not mottled to an objectionable degree.

A still further object of the present invention is to provide a developer sheet useful for forming high density images wherein the developer sheet is used in a photosensitive imaging system.

These, and other objects will be readily recognized and understood by one skilled in the art as reference is made to the following detailed description of the preferred embodiments.

BRIEF DESCRIPTION OF THE DRAWINGS

The present invention will be explained in more detail by reference to the accompanying drawings wherein.

DETAILED DESCRIPTION OF THE PREFERRED EMBODIMENT

In describing the preferred embodiments, certain terminology will be utilized for the sake of clarity. It is intended that such terminology includes not only the recited embodiments, but all technical equivalents which operate in a similar manner, for a similar purpose, to achieve a similar result.

The present invention may be used for any transfer system containing a donor or imaging sheet and a developer sheet wherein the donor or imaging sheet contains an imageforming agent capable of reacting with a developer material to form an image, the developer sheet contains a developer material capable of reacting with the image-forming agent, and wherein, to produce a visible image, the donor or imaging sheet is aligned with the developer sheet and pressure is applied to the sheets to cause transfer of the image-forming agent to the developer sheet. It is particularly envisioned that the inventive developer sheet be used in association with imaging sheets containing photosensitive microcapsules containing an image-forming agent. However, it is envisioned that the inventive developer sheet may be used in association with any transfer image-forming system.

In accordance with a preferred embodiment, the imaging system of the present invention includes an imaging sheet having a layer of photosensitive microcapsules and a developer sheet. The imaging sheet, as well as the photosensitive compositions, photoinitiators, color formers, wall formers, encapsulation techniques and developer materials described in U.S. Pat. Nos. 4,399,209; 4,772,530; and 4,772,541 to The Mead Corporation are useful herein. These patents are incorporated herein by reference.

Figure 1:
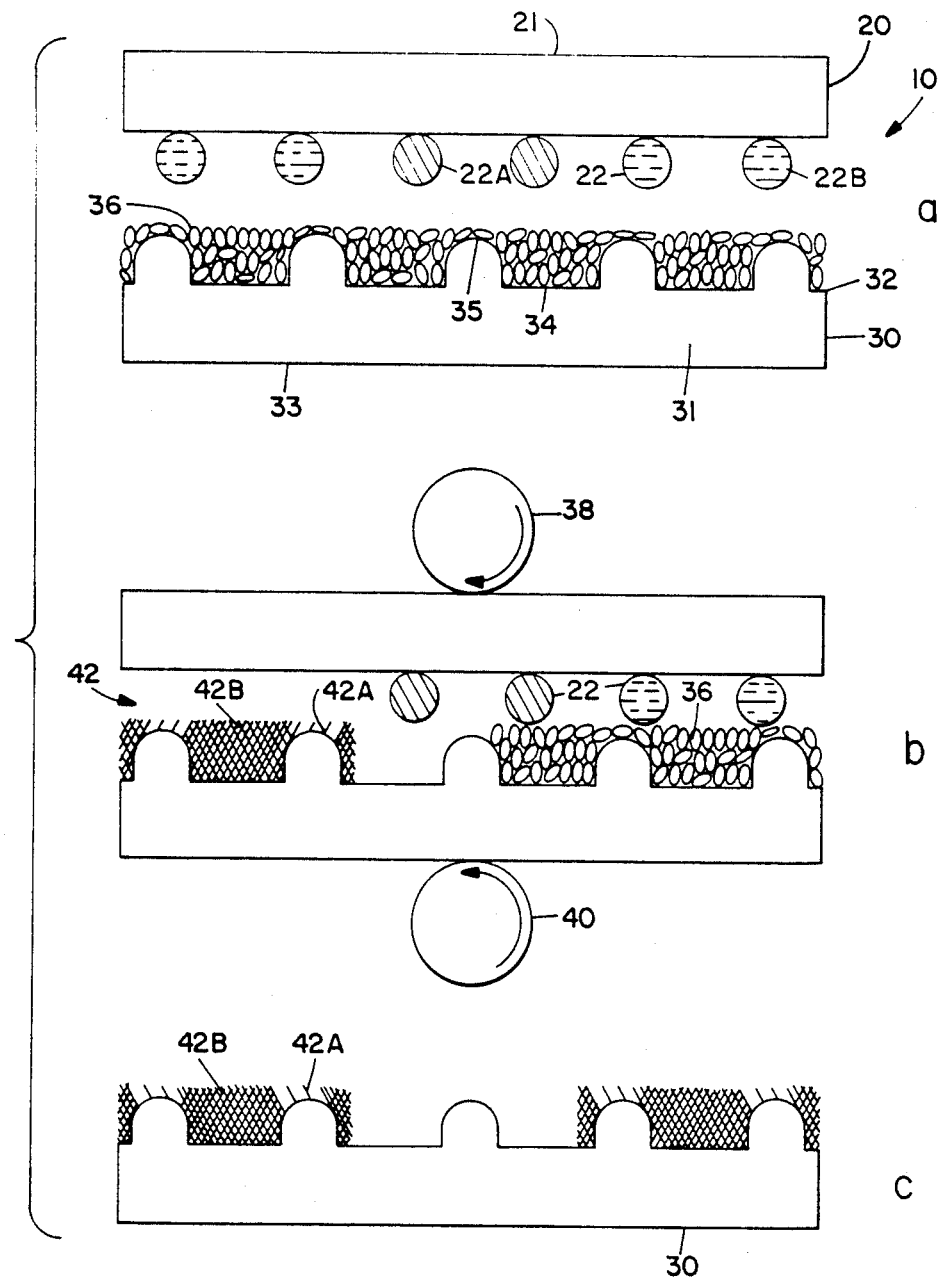
FIGS. 1(a)–(c) are cross sectional views of an imaging system and process including an imaging sheet and a developer sheet embodying the teachings of the instant invention.

An imaging system employing one embodiment of an inventive developer sheet is shown in FIG. 1 and is represented by element 10. System 10 includes imaging sheet 20 and developer sheet 30. Imaging sheet 20 comprises a support 21 having a layer 22 of photosensitive microcapsules 22A and 22B coated on the surface thereof. The microcapsules, prior to exposure, typically contain as their internal phase a photohardenable composition and a colorless color-forming agent. The microcapsules shown in FIG. 1(a) have already been image-wise exposed to actinic radiation such that the internal phase of microcapsules 22A have photohardened whereas the internal phase of microcapsules 22B remain liquid. The exposure details and details of the internal phases of the microcapsules are more thoroughly described in U.S. Pat. 4,399,209.

Developer sheet 30 includes substrate 31 having a front surface 32 and a back surface 33. Substrate 31 is made of transparent polymeric materials such as polyethylene terephthalate, translucent substrates, opaque polymeric substrates such as Melinex 329 and Melinex 470 sold by ICI Americas, or polymer coated paper materials. Coated paper materials include commercial available photographic papers. Front surface 32 is microroughened such that surface 32 has regions of higher substrate thickness 35 and regions of lower substrate thickness 34. The microroughening of surface 32 is obtained by calendaring the polymeric substrate or polymer coating against a roughened roller after formation of the substrate into a sheet, solvent etching the polymeric substrate or polymer coating after formation of the substrate into a sheet, including a pigment such as titania into the polymer material or coating prior to sheet formation or casting the polymeric material or coating against a rough surface prior to sheet formation.

Coated onto surface 32 is particulate developer material 36. As seen in FIG. 1(a), more developer material 36 is maintained on sheet 30 in the areas having regions of lower thickness 34 and less material 36 is maintained in the regions of higher thickness 35.

Referring to FIG. 1(b), the advantages of utilizing the microroughened substrate are shown in greater detail. To form an image on substrate 31, imaging sheet 20 and developer sheet 30 are aligned so that the walls of microcapsules 22 contact the layer of developer particles 36. They are then passed together, as an assembly, through pressure rolls 38 and 40. This causes the non-photohardened microcapsules 22B to rupture so that their internal phase contents release whereupon the image-forming agent contacts developer material 36 to form a visible image 42. In the areas laying directly above the higher substrate thickness areas 35, the image has a slightly lesser density because of developer particles 36 having been compressed as a result of the pressure created by rolls 38 and 40 and sheets 20 and 30 and is represented by element 42A. By comparison, the images produced in the areas laying directly above lower substrate thickness areas 34 have a higher density and are represented by element 42B. The high density images 42B result because the developer particles 36 located in these areas are not highly compressed, resulting in an increased pore volume for the chromogenic material to transfer to. Material 36 does not highly compress in these areas because most of the pressure which is exerted as a result of the forces of rollers 38 and 40 is absorbed by regions 35. Once sheets 20 and 30 have passed through rollers 38 and 40, sheet 20 is removed, leaving developer sheet 30 having high density images on its upper surface. The resultant sheet is shown in FIG. 1(c).

In the preferred embodiment, the distance between adjacent high substrate thickness areas 35 is approximately 10 to about 40 microns. This spacing enables the density of the overall image produced to be maintained at a maximum. In reality, as shown in FIGS. 1(b) and 1(c), the produced image is actually an alternating pattern of high density and low density images. However, due to the intimate spacing, the overall appearance is one of a continuous, high density image. It is particularly important that the spacing between adjacent regions 35 not be too great as this will pronounce the high density-low density image effect and produce a mottled appearance.

Figure 2:
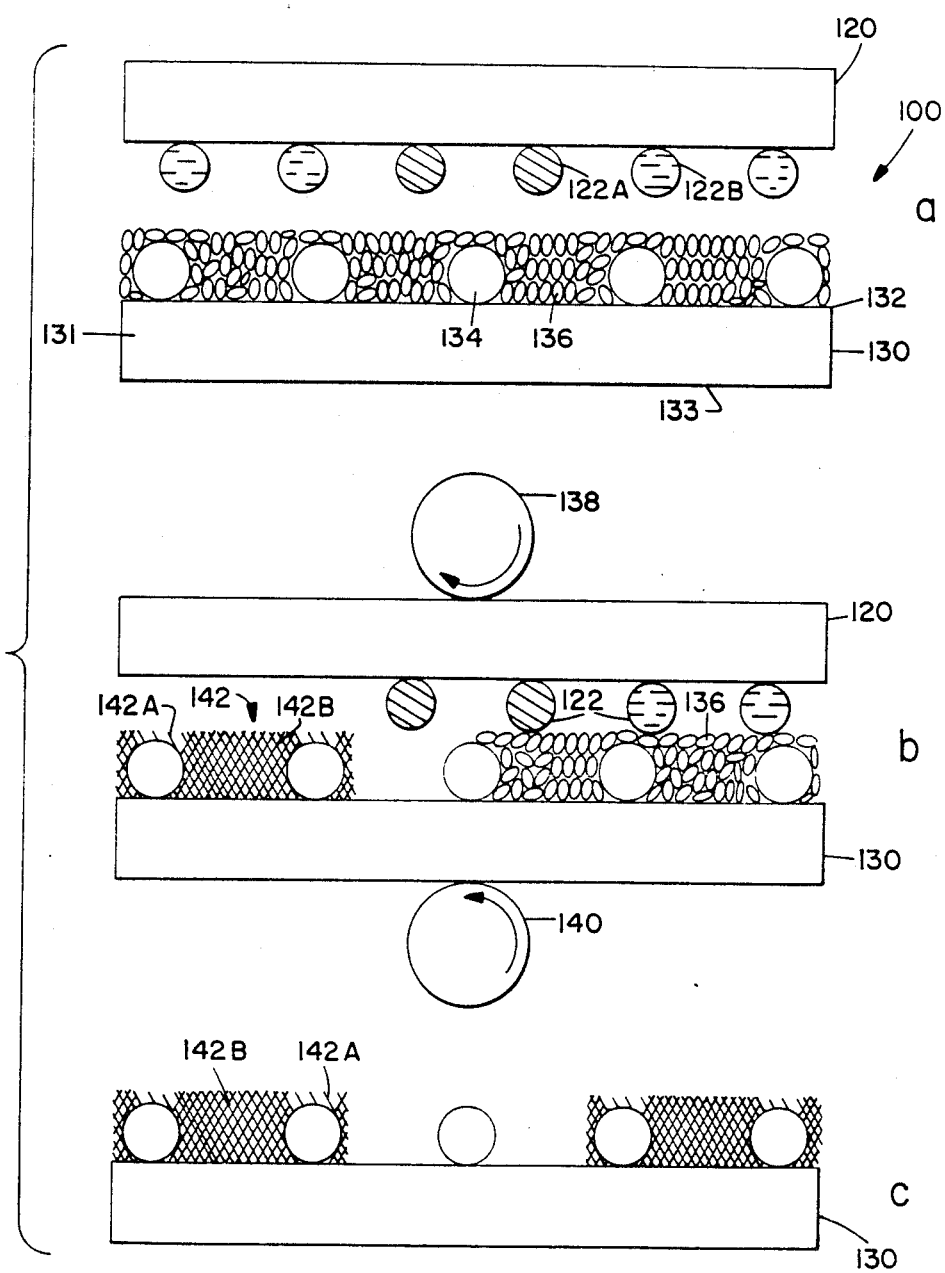
FIGS. 2(a)–(c) shows an alternative imaging system and process including a developer sheet embodying the teachings of the instant invention.

An imaging system employing an alternative embodiment of an inventive developer sheet is shown in FIG. 2 and is represented by element 100. System 100 includes imaging sheet 120 and developer sheet 130. Imaging sheet 120 is identical to sheet 20 of FIG. 1, and has already been image-wise exposed to actinic radiation.

Developer sheet 130 includes substrate 131 having a front surface 132 and a back surface 133 and is made of the same materials as described with respect to FIG. 1. Located on the front surface of 132 are pressure absorbing particles 134 and particulate developer material 136. Particles 134 are characterized by being noncompressible in that they do not substantially deform when subjected to pressure. These particles are typically known in the art of carbonless paper production as stilt materials and function primarily to prevent undesirable compression of developer particles 136.

Referring to FIG. 2(b), the advantages of utilizing the inventive substrate are shown in greater detail. As is the case with the system of FIG. 1, the imaging sheet 120 and developer sheet 130 are brought into alignment and are passed between pressure rollers 138 and 140. This causes the walls of microcapsules 122B to rupture and enable their internal phase to release and migrate to developer material 136 to form a visible image 142.

When pressure is exerted on developer sheet 130, particles 134, because of their noncompressible nature, act to absorb the pressure load. This provides protection to the developer material 136 located physically below the top of particles 134 on substrate 131. In the areas where developer material 136 is located above the top of particles 134, material 136 will be compressed as a result of the pressure forces. The produced images in these areas will not achieve a maximum color density and are indicated by 142A. However, in the areas where material 136 lies below the top of particles 134, particles 134 act to absorb the pressure forces and protect material 136 from undesirable compression. As a result, these areas are highly porous and high density images, as represented by element 142B, are produced.

As is the case with the system of FIG. 1, the resulting image, as shown in FIG. 2(c), has areas of high color density 142B and areas of low density 142A. However, because of the close spacing maintained between particles 134, typically between 10 microns and about 40 microns, the overall appearance is one of high color density. As is the case with the system of FIG. 1, the spacing of particles 134 must be intimate so that the high density image appears continuous and not mottled.

Figure 3:
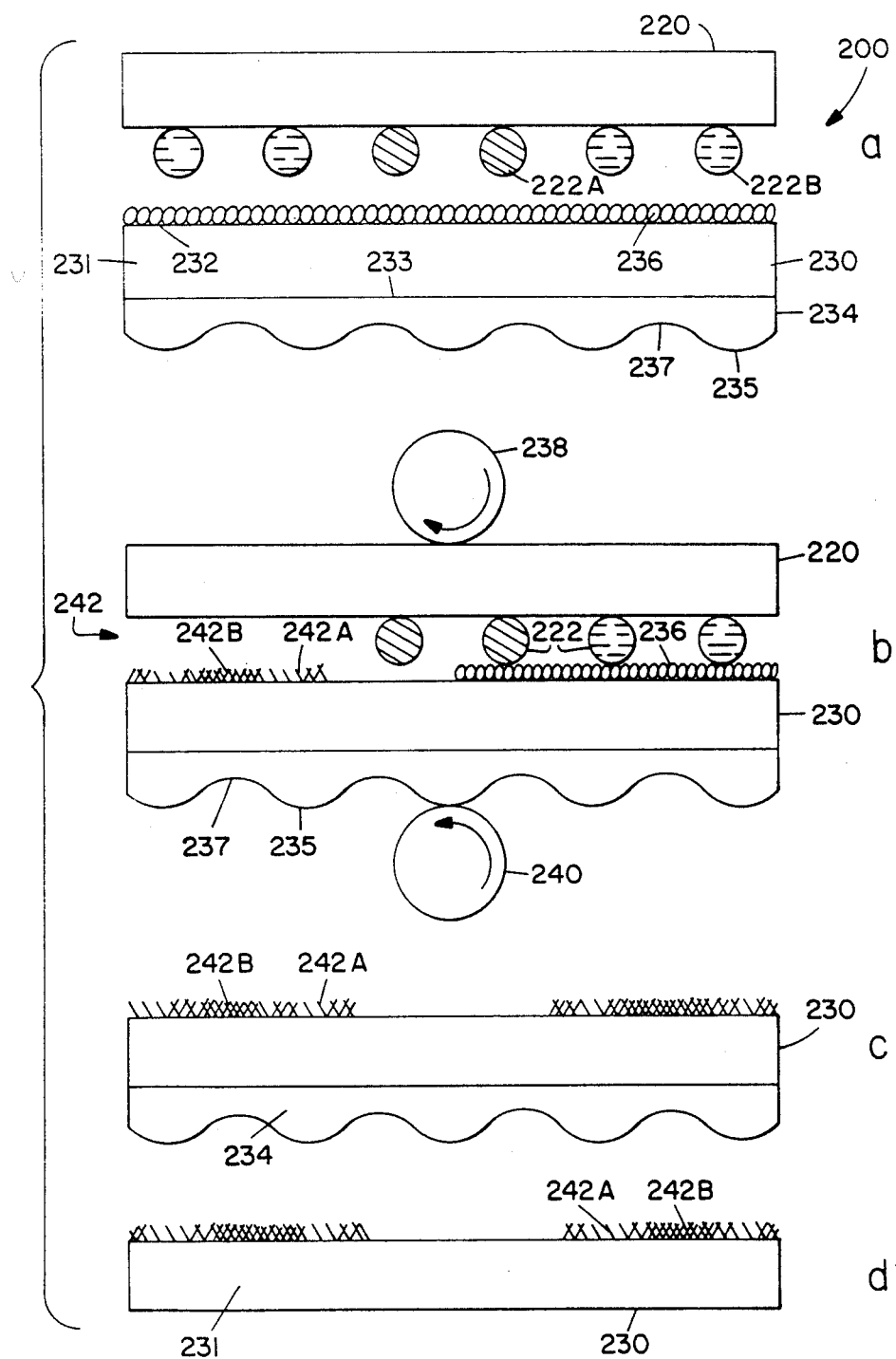
FIGS. 3(a)–(d) shows another alternative embodiment of an imaging system and process including a developer sheet embodying the teachings of the instant invention.

An imaging system employing another alternative embodiment of an inventive developer sheet is shown in FIG. 3 and is represented by element 200. System 200 includes imaging sheet 220 and developer sheet 230. Imaging sheet 220 is identical to sheet 20 of FIG. 1, and has already been image-wise exposed to actinic radiation.

Developer sheet 230 includes substrate 231 having a front surface 232 and a back surface 233 and is made of the same materials as described with respect to FIG. 1. Located on front surface 232 is a uniform layer of particulate developer material 236. The thickness of layer 236 is about 10 microns. Attached to back surface 233 is releasable backing sheet 234. The face of sheet 234 attached to surface 233 is applied onto surface 233 by means known in the art, such as pressure sensitive adhesives. The use of a pressure sensitive adhesive enables sheet 234 to be easily released from substrate 231 after the development procedure has been completed.

Sheet 234 is discontinuous in thickness, having regions 235 of high sheet thickness and regions 237 of lower sheet thickness. The use of a release sheet having a discontinuous thickness enables the production of high color density images in a manner akin to that described above with respect to FIG. 1.

Referring to FIG. 3(b), sheets 220 and 230 are passed between pressure rollers 238 and 240 to cause the walls of microcapsules 222B to rupture. This causes the internal contents to release and contact developer material 236 to form a visible image 242. In the areas where pressure rollers 238 and 240 contact high sheet thickness regions 235, a greater amount of pressure is exerted upon sheets 220 and 230, causing developer material 236 located directly above these regions to slightly compress. As a result, the density of the produced image 242A is not as high as possible. By comparison, less pressure is exerted in the regions laying directly over lower sheet thickness regions 237. Thus, compression of these areas, and particularly developer material 236, is minimized, resulting in no substantial loss of porosity of the spaces between particles 236. The images produced in these areas 242B, are of a high density. Once imaging sheet 220 and developer sheet 230 have passed through rolls 238 and 240, backing sheet 234 is removed, leaving substrate 231 having located on its upper surface images of high density, 242B and of lower density 242A.

As is the cause with the system of FIG. 1, the space between adjacent high sheet thickness regions 235 is maintained between about 10 microns and about 40 microns to provide a visual image which appears to be of a uniform high density. If the space between adjacent high sheet thickness regions 235 is too great, a mottled appearance may occur.

In still another embodiment, not pictured, the developer sheet has a microroughened back surface. This embodiment is identical to that shown in FIG. 3 with the exception that the uneven thickness backing layer is not adhered to the developer substrate, but rather, is integrally formed onto the back surface of the developer sheet.

In still another embodiment, not pictured, the backing layer is attached to the donor sheet on the face not containing the microcapsules. As a result of the discontinuous thickness of the backing layer, a similar pressure profile to that discussed with respect to FIG. 3 is obtained to enable the production of high density images. In addition, because the imaging sheet is ultimately discarded, the backing layer need not be removed from the imaging sheet after transfer, or it may be integrally formed onto the imaging sheet.

The particulate reactive material in the developer layer of the developer sheet is selected such that it reacts with the chromogenic material associated with the microcapsules of the imaging sheet and produces a color image. In the most typical embodiments, the chromogenic material is a substantially colorless electron donating compound of the type conventionally used in the pressure-sensitive recording art and the developer material is an electron accepting compound.

The reactive developer can be selected from among the developers conventionally used in carbonless paper including acid clay, active clay, attapulgite, etc.; organic acids such as tannic acid, gallic acid, propylgallate; aromatic carboxylic acids such as benzoic acid, p-tert-butyl-benzoic acid, 4-methyl-3-nitrobenzoic acid, salicylic acid, 3-phenyl salicylic acid, 3-cyclohexyl salicylic acid, 3-tert-butyl-5-methyl salicylic acid, 3,5-di-tert-butyl salicylic acid, 3-methyl-5-benzyl salicylic acid, 3-phenyl-5-($\alpha,\alpha$-dimethylbenzyl)salicylic acid, 3-cyclohexyl-5-$\alpha$, $\alpha$-dimethylbenzyl)salicylic acid, 3-($\alpha,\alpha$-dimethylbenzyl)-5-methyl salicylic acid, 3,5-dicyclohexyl salicylic acid, 3,5-di-$\alpha$-methylbenzyl)salicylic acid, 3,5-di-($\alpha,\alpha$-dimethylbenzyl)salicylic acid, 3-($\alpha$-methylbenzyl)-5-($\alpha,\alpha$-dimethylbenzyl)salicylic acid, 4-methyl-5-cyclohexyl salicylic acid, 2-hydroxy-1-benzyl-3-naphthoic acid, 1-benzoyl-2-hydroxy-3-naphthoic acid, 3-hydroxy-5-cyclohexyl-2-naphthoic acid and the like, and polyvalent metallic salts thereof such as zinc salts, aluminum salts, magnesium salts, calcium salts and cobalt salts as disclosed in U.S. Pat. Nos. 3,864,146; 3,924,027 and 3,983,292; phenol compounds such as 6,6'-methylenebis-(4-chloro-m-cresol) as disclosed in Japanese Patent Publications 9,309 of 1965 and 20,144 of 1967, and Japanese Laid Open Patent Publication No. 14,409 of 1973; phenol resins such as phenol-aldehyde resins e.g., p-phenyl-phenolformaldehyde resin and phenol-acetylene resins, e.g., p-tert-butylphenol-acetylene resin, and polyvalent metallic salts thereof such as zinc modified phenyl formaldehyde resin as disclosed in U.S. Pat. No. 3,732,120; acid polymers such as maleic acid-rosin resin and copolymers of maleic anhydride with styrene, ethylene or vinylmethylether; and aromatic carboxylic acid-aldehyde polymers, aromatic carboxylic acid-acetylene polymers and their polyvalent metallic salts as disclosed in U.S. Pat. Nos. 3,767,449 and 3,772,052.

The phenolic resins may be further modified to include amounts of unsubstituted or substituted salicylic acids in a manner known in the art.

Another class of phenolic resin useful in the present invention is the product of oxidative coupling of substituted or unsubstituted phenols or bisphenols. Oxidative coupling may be catalyzed by various catalysts but a particularly desirable catalyst is the enzyme, horseradish peroxidase. Particularly desirable developers are the resins described in commonly assigned U.S. Pat. No. 4,647,952, which is incorporated herein by reference, and more particularly the product of oxidative coupling of bisphenol A.

Especially preferred particulate developer materials are phenol-formaldehyde condensation products. More particularly, alkylphenolic resins and, still more particularly, metallated products of alkylphenolic resins are preferred. The alkyl phenols are monosubstituted by an alkyl group which may contain 1 to 12 carbon atoms. Examples of alkyl phenols are ortho- or para- substituted ethylphenol, propylphenol, butylphenol, amylphenol, hexylphenol, heptylphenol, octylphenol, nonylphenol, t-butylphenol, t-octylphenol, etc.

Another class of thermoplastic developer material which may be practiced within the scope of the present invention is a resin-like condensation product of a polyvalent metal salt, such as a zinc salt, and a phenol, a phenol-formaldehyde condensation product, or a phenol-salicylic acid-formaldehyde condensation product. This developer material is available from Schenectady Chemical Co. under the designation HRJ 4250 and HRJ 4542. These products are reported to be a metallated condensation product of an ortho- or para-substituted alkylphenol, a substituted salicylic acid, and formaldehyde.

Optionally incorporated with the thermoplastic developer material is one or more surfactants or plasticizers. The surfactant(s) or plasticizer(s) is selected to specifically complement the developer material to aid the developer material in coalescing and, particularly in the case of transparencies, to aid in coating. The material is preferably present in an amount of about 0.05 to 5 parts per 100 parts of developer material, more preferably about 0.5 to 1.5 parts per 100 parts. Examples of such materials include terphenyls and sodium sulfosuccinic acid.

The aforementioned developers are applied to the developer support in a conventional manner. They may be mixed with a binder latex, polyvinyl alcohol, maleic anhydride styrene copolymer, starch, gum arabic, etc., and coated on a substrate such as paper or coated directly. The thickness of the developer layer ranges from about 6 microns to about 15 microns.

When sheet 30, 130 or 230 is a transparent material or coating layer such as polyethylene terephthalate, developer material 36, 136 or 236 may be overcoated with a discontinuous pigment (not pictured). As discussed in greater detail in U.S. Pat. No. 4,554,235, after development, the receiver sheet may be heated or subjected to pressure to cause the pigment to fuse and form an essentially transparent glossy polymeric film over the developed image.

Typical examples of useful pigments are pigments obtained upon drying DOW XD 899301 latex, Dow 722 latex, Dow 788 latex, products of Dow Chemical Co., UCAR 4630x latex, UCAR 4510 latex, styrene-acrylic latices of Union Carbide Corp., polyvinyl acetate emulsion 202A, a product of Union Oil Company of California, polystyrene latices 5611 and 5612, products of Union Oil Co. of California, Polysar 1183, Polysar 9010-P and Polysar 1164, polystyrene latices of Polysar Latex Co., acrylic latex 200, a product of Union Oil Co. of California, polyvinylidene chloride lattices, 542 and MS-153, products of Union Oil Co. of California, Casco wax, a wax emulsion from Borden Co., and Paraco, a wax emulsion from Hercules Chemical Co. Because these latices are non-film forming, a small amount of a binder is usually used with the latex and adhere it to the developer sheet. Preferably, a binder is used in an amount of about 0.5 to 10% by weight based on the coated solid mixture. Suitable binders include starch, polyvinyl alcohol, gelatin, and film forming acrylic, vinyl acrylic and polyvinylidene chloride latices. The binder must not be used in an amount which creates a barrier to permeation of the layer by the internal phase.

The amount of the pigment applied to the developer layer is a function of the nature of the pigment and its particle size. Typically the pigment is employed at an application rate of about 0.1 to 10 g/m$^2$ and more preferably 0.5 to 5 g/m$^2$.

When the developer sheet such as that shown in FIG. 2 contains a stilt material as a pressure absorber, the stilt material should be selected from those materials known in the art. For example, stilt materials have been coated on imaging sheets to prevent color-forming microcapsules from inadvertently rupturing. See, for example, U.S. Pat. Nos. 4,212,437; 4,268,069; 4,486,762; and 4,675,706. Examples of such stilt materials include cooked and uncooked starch particles, pulp and polyolefin materials. Hardened spherical particles such as photohardened microcapsules may also be utilized. In practice, the diameter or the stilt particles ranges from about 6 microns to about 20 microns to prevent undesirable compression of the developer material.

Positive-working photosensitive compositions useful in the present invention usually include a photoinitiator in combination with a monomer, a dimer, or an oligomer which is polymerizable to a higher molecular weight compound, or a polymer which is crosslinked upon exposure. For a negative working material a compound which is depolymerizable or otherwise photolyzable upon exposure is used.

Ethylenically unsaturated organic compounds are useful photosensitive materials. These compounds contain at least one terminal ethylene group per molecule. Typically, liquid ethylenically unsaturated compounds having two or more terminal ethylene groups per molecule are preferred. Examples of this preferred subgroup are ethylenically unsaturated acid esters of polyhydric alcohols such as ethylene glycol dimethacrylate, triethylene glycol dimethacrylate, trimethylolpropane triacrylate (TMPTA) and trimethyol propane trimethacrylate. Another example of a useful radiation sensitive composition is an acrylate prepolymer derived from the partial reaction of pentaerythritol with acrylic acid, methacrylic acid, or acrylic or methacrylic acid esters. Another group of substances useful as photosensitive compositions include isocyanate modified acrylic, methacrylic and itaconic acid esters of polyhydric alcohols.

In most cases, the photosensitive composition includes a photoinitiator. It is possible to use either homolytic photoinitiators which are converted to an active species by radiation and generate a radical by abstracting a hydrogen from a hydrogen donor, or photoinitiators which complex with a sensitizer to produce a free radical generating species, or photoinitiators which otherwise generate radicals in the presence of a sensitizer. If the system relies upon ionic polymerization, the photoinitiator may be of the anion or cation generating type, depending on the nature of the polymerization.

Examples of photoinitiators useful in the present invention include diaryl ketone derivatives, and benzoin alkyl ethers. The photoinitiator is selected based on the sensitivity of the system that is desired. Where ultraviolet sensitivity is desired, suitable photoinitiators include alkoxy phenyl ketones, O-acylated oximinoketones,: polycyclic quinones, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones, and haloalkanes. In many cases it is advantageous to use a combination of imaging photoinitiators.

For use as visible light photoinitiators, the reactive dye-counter ion photoinitiators disclosed in U.S. Pat. Nos. 4,772,530 and 4,772,541 are particularly preferred.

It is possible to use various compounds as the chromogenic materials in the present invention. If the chromogenic material is encapsulated with the photosensitive composition, it should not interfere with the sensitivity of the system. One example of chromogenic material useful in the invention is colorless electron donating compounds. Representative examples of such color formers include substantially colorless compounds having in their partial skeleton a lactone, a lactam, a sulfone, a spiropyran, an ester or an amido structure such as triarylmethane compounds, bisphenylmethane compounds, xanthene compounds, fluorans, thiazine compounds, spiropyran compounds and the like. Crystal Violet Lactone, Copikem X, IV and XI (products of Hilton-Davis Co.) and commercially available cyan, yellow and magenta color forming agents are often used alone or in combination as color precursors in the present invention.

The photosensitive microcapsules used in the present invention are easily formed using conventional techniques such as coacervation, liquid-liquid phase separation, interfacial polymerization and the like. Various melting, dispersing and cooling methods may also be used.

The photosensitive compositions are usually oleophilic and can be encapsulated in hydrophilic wall-forming materials such as gelatin-type materials (see U.S. Pat. Nos. 2,730,456 and 2,800,457 to Green et al.) including gum arabic, polyvinyl alcohol, carboxymethylcellulose; resorcinol-formaldehyde wall formers (see U.S. Pat. No. 3,755,190 to Hart et al.); isocyanate wall-formers (see U.S. Pat. No. 3,914,511 to Vassiliades); isocyanate-polyol wall-formers (see U.S. Pat. No. 3,796,669 to Kiritani et al.); urea formaldehyde wall-formers, particularly urea-resorcinol-formaldehyde in which oleophilicity is enhanced by the addition of resorcinol (see U.S. Pat. Nos. 4,001,140; 4,087,376 and 4,089,802 to Foris et al.); and melamine-formaldehyde resin and hydroxypropyl cellulose (see commonly assigned U.S. Pat. No. 4,025,455 to Shackle).

The developer sheet of the present invention is particularly useful in full color imaging systems such as those described in U.S. Pat. Nos. 4,772,530 and 4,772,541, which are incorporated herein by reference. The microcapsules used in full color imaging individually contain cyan, magenta and yellow color formers and photosensitive compositions having distinctly different sensitivities. A uniform mixture of the microcapsules is distributed over the surface of the imaging support. As is explained in more detail in the above-listed references, each set of microcapsules is primarily sensitive in a different wavelength band such that the microcapsules can be individually exposed with minimum cross-talk. In panchromatic systems, the cyan, magenta, and yellow forming photosensitive microcapsules are respectively sensitive to red, green and blue light.

In addition to being useful in photosensitive systems of the type described above, the developer sheet of the present invention is also useful in conventional pressure-sensitive carbonless systems.

The present invention is illustrated in more detail by the following non-limiting examples:

EXAMPLE 1

A 1-mil thick polyethylene terephthalate sheet was coated with three sets of photosensitive microcapsules respectively containing cyan, magenta and yellow color-forming agents and a photopolymerizable compound including a monomer and a photoinitiator to be used as a full color-imaging sheet. As a control, the imaging sheet was aligned with a developer sheet comprising 5-mil polyethylene terephthalate having uniformly coated on its front surface a layer of Schnechtady HRJ-4252 particles coated at an amount of 8 g/m$^2$ so that the microcapsules contacted the developer particles. The assembly was then passed through a pair of pressure rollers at a pressure of 350 pli to rupture the microcapsules and thereby enable the color-forming agents to migrate to the developer sheet. The imaging sheet was removed from the developer sheet and discarded, and the density of the image on the developer sheet was measured using a MacBeth densitometer. The measured density was 0.69.

EXAMPLES 214 13

The experiment of Example 1 was repeated with the exception that either: (a) the donor sheet had attached to its surface opposite to the surface contacting the microcapsules a backing sheet having different thicknesses prior to assembling the donor sheet with the developer sheet; or (b) the receiver sheet had attached to its surface opposite the surface containing the developer material a backing sheet having different thicknesses prior to assembling the donor sheet with the developer sheet. The backing material and measured density after transfer are set forth in Table 1.

TABLE 1
Paper Backing Experiment

| Example | Backing Material | (a) Donor Backed | (b) Receiver Backed |
|---|---|---|---|
| 1 | Control | 0.69 | 0.69 |
| 2 | Luxe Kote (Mitsubishi Paper Mills) | 0.78 | 0.75 |
| 3 | Zanders 80 lb. Ironofix | 0.75 | 0.74 |
| 4 | Centura Dull (Consolidated) | 0.78 | 0.76 |
| 5 | 80 lb. B and W Dull (Mead) | 0.75 | 0.74 |
| 6 | White A New Paramount (Oji) | 0.72 | 0.74 |
| 7 | Lustro Dull (S.D. Warren) | 0.72 | 0.73 |
| 8 | Pearl Kote (Mitsubishi Paper Mills) | 0.77 | 0.72 |
| 9 | Centura Dull Text (Consolidated) | 0.73 | 0.72 |
| 10 | Moistrite (Mead) | 0.78 | 0.82 |
| 11 | Mead Matrix | 0.74 | 0.75 |
| 12 | Vintage Velvet 80 lb. Dull (Potlash) | 0.73 | 0.73 |
| 13 | Mead Cocklebond | 0.73 | 0.76 |

In every instance, the use of a backing sheet on either the donor or developer sheet produced higher density images.

EXAMPLE 14

As a control developer sheet 5 mil polyethylene terephthalate was coated with a uniform layer of HRJ-4542 particles at an amount of 8 g/m$^2$. The thickness of the layer was approximately 8 microns. For use as a donor sheet 1 mil polyethylene terephthalate was coated with a set of full color photosensitive microcapsules containing cyan, magenta and yellow color-forming agents. The donor and developer sheets were aligned so that the microcapsules contacted the developer material, the assembly was passed through a pair of pressure rollers operating at 350 pli and the donor sheet was detached and discarded from the developer sheet. The density of the produced image for each of the colors, as well as the percent haze for the samples is set forth in Table 2.

EXAMPLES 15-16

The experiment of Example 14 was repeated with the exception that a stilt material was added to the developer particles prior to coating the developer material onto the developer substrate. For a stilt material, photohardened microcapsules were utilized. Prior to photohardening, the microcapsules contained in their internal phase 150 parts photohardenable monomer (TMPTA), 0.4 parts photoinitiator, 1,1-di-n-heptyl-3,3,3',3'-tetramethyl indocarbocyanine tri-phenyl-n-butyl borate, 36 parts magenta color-forming agent (Hilton Davis HD-5100) and 1.5 parts 2,6-diisopropyl dimethylaniline. The microcapsules were placed in a one-liter round bottom flask and exposed to light from a 15-watt cool-white fluorescent tube for 24 hours to fully polymerize the TMPTA and harden the microcapsules. The diameter of the hardened microcapsules ranged from about 3 microns to about 10 microns. A developer coating layer was produced by mixing 99.9% of the developer material of Example 14 and 0.1% of the hardened microcapsules (W/W). The experiement of Example 14 was repeated and the results are set forth in Table 2. Similarly, a coating layer was produced by mixing together 99.5% of the developer material of Example 14 and 0.5% of the hardened microcapsules (W/W). The results are set forth in Table 2.

TABLE 2

| Example | Sample | Cyan density | Magenta density | Yellow density | Black density | Haze |
|---|---|---|---|---|---|---|
| 14 | control | 0.45 | 0.26 | 0.41 | 0.61 | 11.6 |
| 15 | 0.1% stilt material | 0.50 | 0.29 | 0.42 | 0.67 | 12.7 |
| 16 | 0.5% stilt material | 0.48 | 0.29 | 0.44 | 0.68 | 12.0 |

As seen by the data, the addition of the stilt material increased the density of the image produced from each of the color-forming reactions.

Having described the invention in detail and by reference to preferred embodiments thereof, it will be apparent that modifications and variations are possible without departing from the scope of the appended claims.

What is claimed is:

1. A developer sheet useful in forming images having a high density comprising a support which comprises a transparent polymeric material or a polymer coated paper material having front and back surfaces wherein said transparent polymer material or polymer coated paper material is microroughened to provide a discontinuous texture having alternating regions of relatively high and relatively low sheet thickness wherein the space between adjacent high sheet thickness region is between about 10 microns and about 40 microns; and a developer layer containing a particulate reactive material on said front surface, the majority of said particles being located between said adjacent high sheet thickness regions, said reactive material being capable of reacting with a substantially colorless chromogenic material upon contact and generating an image.

2. The developer sheet according to claim 1 wherein said sheet is useful in a photosensitive imaging system.

3. The developer sheet according to claim 2 wherein said support comprises a polymeric material.

4. The developer sheet according to claim 3 wherein said support comprises polyethylene terephthalate.

5. The developer sheet according to claim 2 wherein said support comprises polymer coated paper.

6. The developer sheet according to claim 2 wherein said reactive material comprises an electron accepting compound.

7. The developer sheet according to claim 6 wherein said electron accepting compound is selected from the group consisting of acid clays, aromatic carboxylic acids and polyvalent metal salts thereof, phenolic resins and polyvalent metal salts thereof, and polymers of aromatic carboxylic acids with aldehydes or actylene and polyvalent metal salts thereof.

8. The developer sheet according to claim 1 wherein said support is microroughened by calendaring the polymeric substrate or polymer coating against a roughened roller after formation of the substrate into a sheet, solvent etching the polymeric substrate or polymer coating after formation of the substrate into a sheet, including a pigment in the polymer substrate or coating prior to sheet formation or casting the polymeric substrate or coating against a rough surface prior to sheet formation.

9. The developer sheet according to claim 7 wherein said sheet further comprises a discontinuous layer of a thermoplastic polymeric pigment overlying said developer layer, said polymeric pigment being capable of forming an essentially transparent film upon the application of heat or pressure.

10. A microencapsulated imaging system comprising an imaging sheet including a support having a layer of photosensitive microcapsules on the surface thereof, said microcapsules containing a photohardenable or photosoftenable composition as the internal phase and having a chromogenic material associated therewith; and a developer sheet according to claim 2;

wherein said chromogenic material and said developer material are capable of reacting to form a visible image on said developer sheet.

11. The system according to claim 10 wherein said system is capable of producing full color visible images.

12. The system according to claim 11 wherein said system further comprises a discontinuous layer of a thermoplastic polymeric pigment overlying said developer layer sheet, said polymeric pigment being capable of forming an essentially transparent film upon the application of heat or pressure.

* * * * *